(12) United States Patent
Ono et al.

(10) Patent No.: US 7,538,423 B2
(45) Date of Patent: May 26, 2009

(54) HEAT SINK, ELECTRONIC DEVICE, METHOD OF MANUFACTURING HEAT SINK, AND METHOD OF MANUFACTURING ELECTRONIC DEVICE

(75) Inventors: Tomio Ono, Yokohama (JP); Tadashi Sakai, Yokohama (JP); Naoshi Sakuma, Yokohama (JP); Hiroaki Yoshida, Yokohama (JP); Mariko Suzuki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 27 days.

(21) Appl. No.: 11/534,355

(22) Filed: Sep. 22, 2006

(65) Prior Publication Data
US 2007/0216024 A1    Sep. 20, 2007

(30) Foreign Application Priority Data
Mar. 17, 2006    (JP)    ............................. 2006-074746

(51) Int. Cl.
  H01L 23/10    (2006.01)
  H01L 23/34    (2006.01)
(52) U.S. Cl. .................. 257/706; 257/713; 257/712; 257/E23.103
(58) Field of Classification Search ............ 257/712, 257/713, 722, E23.103, 706
See application file for complete search history.

(56) References Cited

U.S. PATENT DOCUMENTS

| | | | | | |
|---|---|---|---|---|---|
| 3,371,148 | A | * | 2/1968 | Roques et al. | 174/553 |
| 4,765,400 | A | * | 8/1988 | Chu et al. | 165/185 |
| 5,391,895 | A | * | 2/1995 | Dreifus | 257/77 |
| 6,046,498 | A | * | 4/2000 | Yoshikawa | 257/706 |
| 6,750,534 | B2 | * | 6/2004 | Aquien et al. | 257/675 |
| 6,753,488 | B2 | | 6/2004 | Ono et al. | |
| 2002/0130407 | A1 | * | 9/2002 | Dahl et al. | 257/712 |
| 2003/0183368 | A1 | * | 10/2003 | Paradis et al. | 165/80.3 |
| 2006/0086118 | A1 | * | 4/2006 | Venkatasubramanian et al. | 62/259.2 |

FOREIGN PATENT DOCUMENTS

JP    2002-519846    7/2002

OTHER PUBLICATIONS

A. Aleksov, et al., "Silicon-on-Diamond: An Engineered Substrate for Electronic Applications", Proceeding of 8th Applied Diamond Conference Nanocarbon, 2005, 1 page.

* cited by examiner

*Primary Examiner*—Nitin Parekh
(74) *Attorney, Agent, or Firm*—Oblon, Spivak, McClelland, Maier & Neustadt, P.C.

(57) ABSTRACT

A heat sink includes a base portion formed of insulating diamond, and a plurality of pressure contacting members formed of the insulating diamond and arranged on the base portion

7 Claims, 12 Drawing Sheets

HEAT SINK, ELECTRONIC DEVICE, METHOD OF MANUFACTURING HEAT SINK, AND METHOD OF MANUFACTURING ELECTRONIC DEVICE

CROSS REFERENCE TO RELATED APPLICATION

This application is based upon and claims the benefit of priority from the prior Japanese Patent Application No. 2006-074746, filed on Mar. 17, 2006, the entire content of which is incorporated herein by reference.

BACKGROUND OF THE INVENTION

1. Field of the Invention

This invention relates to a heat sink, an electronic device, a method of manufacturing a heat sink, and a method of manufacturing an electronic device. More particular, this invention relates to a heat sink for discharging heat generated by the operation of an electronic device, a method of manufacturing such a heat sink, an electronic device including such a heat sink, and a method of manufacturing such an electronic device.

2. Description of the Related Art

With the progress in the field of semiconductor manufacturing technology, higher integration of semiconductor elements and a higher speed operation of the circuits have been achieved, leading to rapid improvement in performance of semiconductor elements. In contrast to such technical developments, on the other hand, the heat density (i.e. the amount of heat generated per unit area) of a semiconductor substrate on which a semiconductor element is disposed has tended to increase, which has caused a demand for a method of cooling a semiconductor substrate with high efficiency.

As a method for cooling a semiconductor substrate described above, technology in which a material with high heat conductivity (such as carbon, graphite, metal, ceramic, diamond, or the like) is disposed on a semiconductor substrate is generally known (see Japanese Published Unexamined PCT Patent Application (Kohyo) No. 2002-519846, for example). In particular, diamond has very high heat conductivity, and single crystal diamond has about 5 times, and polycrystalline diamond has about 2.5 times as high heat conductivity as that of copper whose heat conductivity is the highest among general industrial materials. Consequently, diamond has been a focus of great attention as a material for forming a heat sink in the field of semiconductor lasers and microwave oscillators or the like which generate a high amount of heat.

Further, diamond is insulating when no impurities are doped therein. Accordingly, with a diamond film being formed on a top surface of a semiconductor substrate, rather than on a rear surface thereof, it is possible, in principle, to cool the substrate using this diamond substrate.

A heat generation portion of a semiconductor substrate is an active element portion where an active element is mainly formed, and this active element portion locally exists on the surface of the semiconductor substrate. Accordingly, by forming a diamond film having an insulating property and high heat conductivity on the surface of a semiconductor substrate, heat generated from the heat generation portions can be transferred to non-heat generation portions through the diamond film without affecting the operation of the semiconductor element. As a result, the temperature of the semiconductor substrate can be made uniform over the entire surface. As described above, it is important to reduce the temperature of the active element portions (heat generation portions) in order to secure the normal operation and the electrical reliability of the semiconductor element. In this regard, the temperature of the active element portions can be reduced by making the temperature of the semiconductor substrate uniform over the entire surface.

However, the method of cooling a semiconductor substrate by a diamond layer formed on the semiconductor substrate described above has the following disadvantages. Specifically, in the semiconductor manufacturing process, the process of forming a diamond thin film is often introduced after forming semiconductor elements on the semiconductor substrate and then forming a wiring for electrically connecting the semiconductor elements. In general, a diamond thin film can be formed by using a CVD (Chemical Vapor Deposition) method, with the temperature of the substrate being approximately 800° C. However, when an aluminum alloy, for example, is used as the material of the wiring, the wiring, and therefore the semiconductor element, would be damaged at the time of forming the diamond thin film, because the melting point of an aluminum alloy is about 600° C. In addition, due to the fact that the coefficient of thermal expansion of a diamond thin film is smaller than that of silicon, a stress resulting from a temperature cycle is generated between the diamond thin film and the semiconductor substrate, which causes damage on the semiconductor substrate having a lower mechanical strength than the diamond thin film.

On the other hand, nanodiamond thin films have attracted an attention in recent years. While the diamond thin film described above is a polycrystalline film having crystal grains with a grain size in units of micrometerss (μm), a nanodiamond thin film, although it is also a polycrystalline film, contains crystal grains with a grain size in units of nanometers (nm). In addition, nanodiamond thin films can be formed with the temperature of a substrate being 400° C. or lower. Namely, use of a nanodiamond thin film as a heat discharging route would provide an advantage that, in the semiconductor manufacturing process, a diamond thin film can be formed after forming a semiconductor element on the semiconductor substrate and further forming a wiring, with the temperature of the substrate at the time of film formation being set to a temperature equal to or below the melting point of the wiring material. However, while the nanodiamond thin film can be formed at a low temperature, the heat conductivity of nanodiamond, which is the most significant, is low. This is because a nanodiamond thin film contains crystal grains with a small grain size and therefore has a large number of grain boundaries in the heat transmitting route, where propagation of lattice vibration is prohibited. It is therefore difficult to use a nanodiamond thin film to cool the semiconductor device.

BRIEF SUMMARY OF THE INVENTION

The present invention was made to solve the forgoing problems of the related art and is aimed at providing a heat sink having high heat conductivity and excellent cooling efficiency and an electronic device including such a heat sink.

Further, the present invention is aimed at providing a method of manufacturing a heat sink having high heat conductivity and excellent cooling efficiency and a method of manufacturing an electronic device.

A first aspect of the embodiment of the invention relates to a heat sink including a base portion formed of insulating diamond, and a plurality of pressure contacting members formed of the insulating diamond and arranged on the base portion.

A second aspect of the embodiment relates to an electronic device including a substrate that a device is formed having heat generation portions in a first region and having non heat generation portions in a second region which is different from the first region, and a heat sink having a base portion formed of insulating diamond and a plurality of first pressure contacting members which are pressure contacted onto the heat generation portions of the substrate and a plurality of second pressure contacting members which are pressure contacted onto the non heat generation portions of the substrate, the first pressure contacting members and the second pressure contacting members being formed of the insulating diamond and arranged on the base portion.

A third aspect of the embodiment relates to a method of manufacturing a heat sink, the method including forming a porous coat film on a surface of an insulating diamond substrate, forming a large number of holes connecting from a top surface of the porous coat film through a rear surface thereof which is opposite to the top surface, burying a mask inside the holes of the porous coat film, selectively removing the porous coat film, and etching a portion of the insulating diamond substrate in the thickness direction from a top surface of the insulating diamond substrate toward a rear surface thereof which is opposite to the top surface, with the mask being used as an etching mask, to form a plurality of pressure contacting members.

A fourth aspect of the embodiment relates to a method of manufacturing an electronic device, the method including producing a substrate that a device is formed having heat generation portions in a first region and having non heat generation portions in a second region which is different from the first region, producing a heat sink by forming a porous coat film on a surface of an insulating diamond substrate, forming a large number of holes connecting from a top surface of the porous coat film through a rear surface thereof which is opposite to the top surface, burying a mask inside the holes of the porous coat film, selectively removing the porous coat film, and etching a portion of the insulating diamond substrate in the thickness direction from a top surface of the insulating diamond substrate toward a rear surface thereof which is opposite to the top surface, with the mask being used as an etching mask, to form a plurality of pressure contacting members, and pressure contacting the pressure contacting members of the heat sink onto each of the heat generation portions and the non heat generation portions of the substrate.

A fifth aspect of the embodiment relates to a method of manufacturing an electronic device, the method including producing a substrate that a device is formed having heat generation portions in a first region and having non heat generation portions in a second region which is different from the first region, producing a heat sink by estimating a step shape of the surface of the substrate on which the heat generation portions and the non heat generation portions are disposed, etching a surface of an insulating diamond substrate such that the surface of the insulating diamond substrate corresponds to the step shape of the surface of the substrate, forming a porous coat film on the surface of the diamond substrate which is etched, forming a large number of holes connecting from a top surface of the porous coat film through a rear surface thereof which is opposite to the top surface, burying a mask inside the holes of the porous coat film, selectively removing the porous coat film, and etching a portion of the insulating diamond substrate in the thickness direction from a top surface of the insulating diamond substrate toward a rear surface thereof which is opposite to the top surface, with the mask being used as an etching mask, to form a plurality of pressure contacting members, and pressure contacting the pressure contacting members of the heat sink onto each of the heat generation portions and the non heat generation portions of the substrate.

DETAILED DESCRIPTION OF THE INVENTION

First Embodiment

[Structures of Heat Sink and Electronic Device Including Heat Sink]

Figure 1:
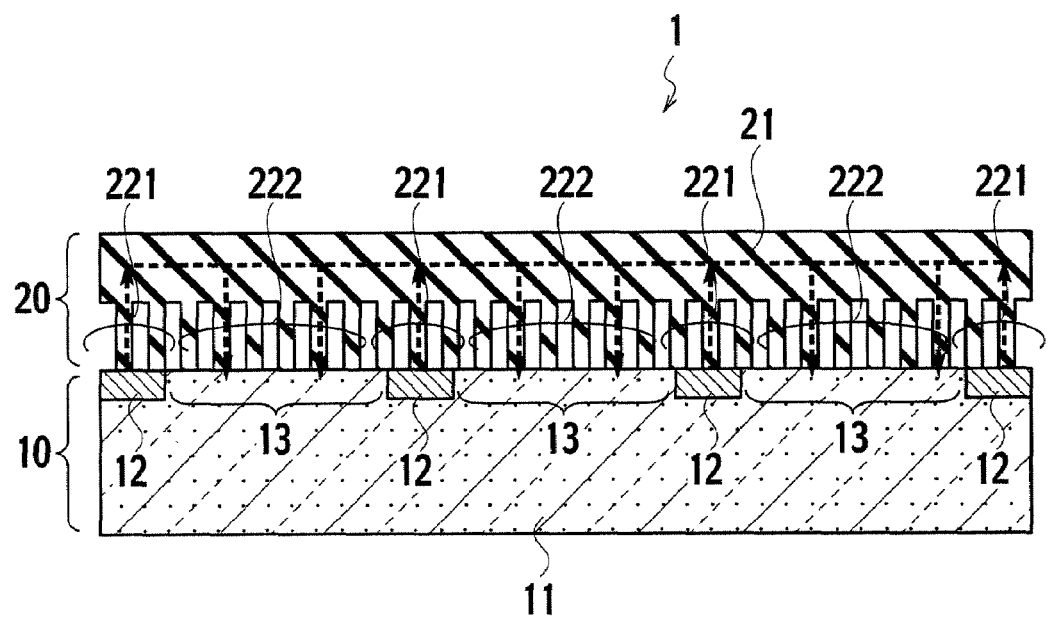
FIG. 1 is a schematic cross section of an electronic device including a heat sink according to a first embodiment of the invention.

As shown in FIG. 1, an electronic device 1 according to a first embodiment includes the substrate 11 that a device is formed and a heat sink 20. The substrate 11 that a device is formed is termed device body 10. The device body 10 includes heat generation portions 12 in first regions of a substrate 11 and non heat generation portions 13 in second regions of the substrate 11 other than the first regions. The heat sink 20 includes a base portion 21 formed of insulating diamond, first pressure contacting members 221 which are pressure contacted onto the heat generation portions 12 of the device body 10, and second pressure contacting members 222 which are pressure contacted on the non heat generation portions 13 of the device body 10. The first and second pressure contacting members 221 and 222 are disposed on the base portion 21 and are formed of insulating diamond similar to the base portion 21.

In the first embodiment, the device body 10 is a semiconductor device which is formed by a silicon (Si) semiconductor chip, and the substrate 11 is an Si single crystal substrate. It should be noted that, in the present invention, the device body 10 is not limited to an Si semiconductor chip, and can be formed by a III-V compound semiconductor chip generating a large amount of heat, such as a laser oscillator, a microwave oscillator, and so on.

In the heat generation portion 12 of the device body 10, an active element such as an insulating gate type field effect transistor (IGFET), a bipolar transistor, or the like which generates heat by the operation thereof is mainly provided. In addition, a circuit including such an active element is disposed on the heat generation portion 12. As used herein, the term "a circuit including an active element" includes a circuit composed of one or a plurality of active elements, a circuit composed of an active element and a passive element, and so on. The passive element includes a resistor, a capacitor, and so on.

The non heat generation portions 13 are regions of the substrate 11 other than the heat generation portions 12. The non heat generation portion 13 includes a region in which the passive element is disposed, a region in which no elements are provided, an insulating separation region for electrically separating the elements, and so on.

FIG. 1 schematically shows the sectional structure of device body 10. In the actual device body 10, active elements and passive elements are disposed on the surface portion of the substrate 11 and a wiring and an interlayer insulating film are alternately provided on these elements. On the surface of the device body 10, namely, in the uppermost layer on the substrate 11, a final passivation film which is not shown is provided.

According to the first embodiment, the heat sink 20 is formed by single crystal or polycrystalline insulating diamond.

Figure 2:
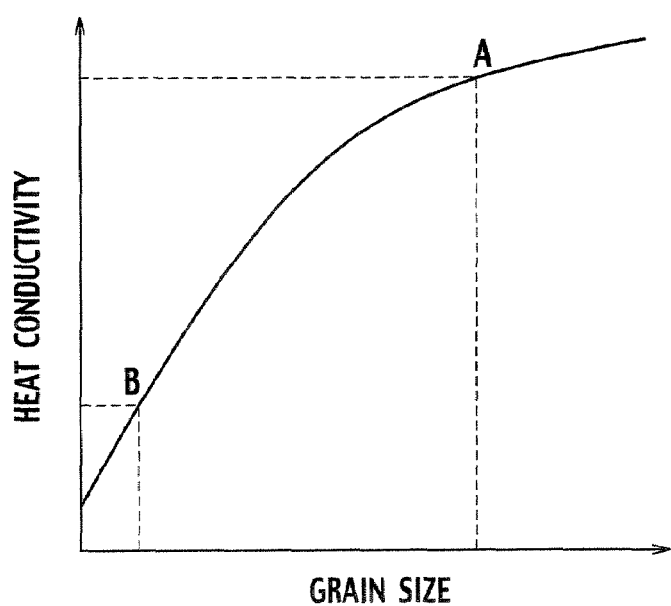
FIG. 2 is a view showing a relationship between the crystal grain size and the heat conductivity of polycrystalline diamond in the heat sink according to the first embodiment.

FIG. 2 schematically shows a relationship between the crystal grain size and the heat conductivity in polycrystalline diamond. In FIG. 2, the horizontal axis indicates the crystal grain size of polycrystalline diamond and the vertical axis indicates the heat conductivity thereof. Further, a sign "A" indicates the heat conductivity of polycrystalline diamond having a grain size in units of μm and a sign "B" indicates the heat conductivity of polycrystalline diamond having a grain size in units of nm. The heat conductivity of polycrystalline diamond having a grain size in units of μm as indicated by "A" is approximately 1000 W/M·K, and the heat conductivity of polycrystalline diamond having a grain size in units of nm as indicated by "B" is approximately 10 W/M·K to approximately 100 W/M·K. Further, the heat conductivity of single crystal diamond having no crystal grain boundaries is approximately 2000 W/M·K.

As described above, it is preferable that insulating diamond is formed of single crystal diamond in the light of the heat conductivity. However, because single crystal diamond is very expensive, it is preferable, in the light of manufacturing costs, to practically use a polycrystalline insulating diamond substrate, in particular, a self-supported insulating diamond substrate. As polycrystalline self-supported insulting diamond substrates are commercially available and can therefore be obtained easily and with low cost, the manufacturing cost for the heat sink 20 and the electronic device 1 can be reduced.

It is further desirable that the polycrystalline insulating diamond substrate is formed of diamond having a grain size in units of micrometers. More specifically, while the heat conductivity of polycrystalline diamond having a grain size of μm is a half that of single crystal diamond, it is 10 to 100 times as high as that of polycrystalline diamond having a grain size of nm, as shown in FIG. 2. The heat conductivity of polycrystalline diamond having an nm size is approximately the same as that of a semiconductor such as Si. The heat conductivity of polycrystalline diamond having a small grain size in units of nm is low for the following reason. Specifically, while diamond transmits heat by lattice vibration, propagation of this lattice vibration is prevented in the polycrystalline diamond having a small grain size of nm due to a large number of crystal grain boundaries existing in the heat transmission route, thereby lowering the heat conductivity.

As shown in FIG. 1, the first pressure contacting members 221 and the second pressure contacting members 222 have a plurality of elongated column shapes projecting from the base portion, and are formed of the same shape. The first pressure contacting members 221 are disposed in regions corresponding to the heat generation portions 12 of the device body 10 and discharge heat generated by the heat generation portions 12 to the base portion 21 as indicated by arrows in FIG. 1. The second pressure contacting members 222 are disposed in regions corresponding to the non heat generation portions 13 of the device body 10 and discharge heat, which is discharged to the base portion 21 from the heat generation portions 12, to the non heat generation portions 13 as indicated by arrows in FIG. 1. In other words, the heat sink 20 is configured to allow the heat generated in the heat generation portions 12 of the device body 10 to be transferred and diffused in the non heat generation portions 13, so that the temperature distribution can be made uniform over the entire surface of the substrate 11, thereby cooling the device body 10. Each of the first pressure contacting members 221 and the second pressure contacting member 222 according to the present embodiment is formed of an elongated column shape with the radial dimension (diameter) being set to 15 nm to 25 nm and the height being set to 1 μm to 2 μm. In the present embodiment, the sizes of substantially all the crystal grains of the heat sink 20 fall within the μm size (i.e. 1 μm≦grain size<10000 μm). With the grain size in the range of several μm to several tens of μm, for example, the first pressure contacting members 221 and the second pressure contacting members 222 have few grain boundaries existing in the height direction (heat transfer direction). Further, it is preferable that the base portion 21 is formed to have a thickness which is several tens of times as large as the height of the first and second pressure contacting members 221 and 222 so as to reduce heat resistance. In other words, it is preferable that the mechanical strengths of the first and second pressure contacting members 221 and 222 are set lower than that of the base portion 21 such that the first and second pressure contacting members 221 and 222 are easy to deform by buckling.

In the present embodiment, the heat sink 20 can be manufactured by an insulating diamond substrate having single crystal, although the material cost and the manufacturing cost increase compared to when a polycrystalline insulating diamond substrate is used. Thus, in the heat sink 20 of the present embodiment, it is optimum to employ insulating diamond having polycrystalline diamond which allows the final low manufacturing cost and can provide the sufficient heat discharging effect.

[Method of Pressure Contacting Device Body and Heat Sink]

A method of pressure contacting the device body 10 and the heat sink 20 in the electronic device 1 according to the first embodiment will be described.

Figure 3:
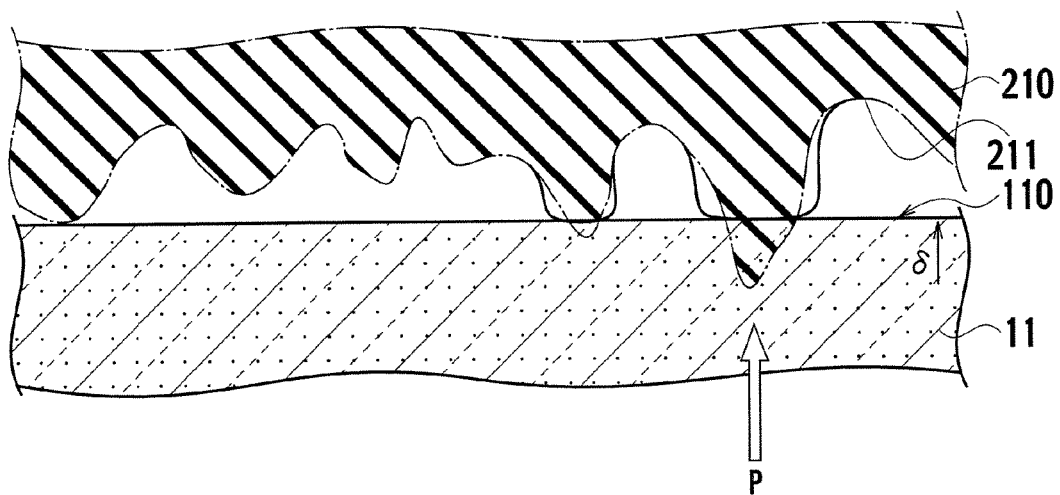
FIG. 3 is a cross section of a main portion showing the pressure contacting state between a device body and a self-supported insulating diamond substrate, for explaining a comparative example of the electronic device according to the first embodiment.

In a case where only a self-supported insulating diamond substrate is used as a heat sink, on a pressure contacting surface 110 on the side of a surface of the substrate 11 of the device body 10, a pressure contacting surface 211 of the self-supported insulating diamond substrate 210 is to be pressure contacted, as shown in FIG. 3. In this case, because the contacting area of the pressure contacting surface 110 and the pressure contacting surface 211 is small, sufficient cooling effect for the device body 10 cannot be achieved. Here, for simplification of explanation, it is assumed that the pressure contacting surface 110 of the substrate 11 has no macro irregularities caused by the shapes of a semiconductor element, an electrode, and so on, or no micro irregularities corresponding to the surface roughness or the like, and that the pressure contacting surface 110 is thus modeled as a smooth surface. On the other hand, the pressure contacting surface 211 of the self-supported insulating diamond substrate 210 is modeled as a non-smooth surface having irregularities corresponding to the surface roughness or the like.

The pressure contacting surface (a smooth surface) 110, approaching the pressure contacting surface (a non-smooth surface) 211, first comes in contact with a convex portion of the pressure contacting surface 211 having the greatest height. In order to allow the pressure contacting surface 110 to contact the next highest convex portion of the pressure contacting surface 211, the highest convex portion which first contacts the pressure contacting surface 110 must be deformed to a great degree. Thus, because a series of these contact and deformation steps are to be repeated, a large pressure contacting load is required so as to have an increased number of contact points between the pressure contacting surface 110 and the pressure contacting surface 211. In particular, with diamond which is the hardest material among all the known substances existing in the natural world, it is difficult to secure a large number of contact points by deformation described above. Consequently, the contact area of the pressure contacting surface 110 on the side of the device body 10 and the pressure contacting surface 211 on the side of the self-supported insulating diamond substrate 210 is very small, which makes it difficult to achieve sufficient heat discharge or sufficient heat dissipation between the device body 10 and the self-supported insulating diamond substrate 210, and therefore sufficient cooling effect cannot be obtained.

Further, as the actual contact surface 110 of the device body 10 includes macro irregularities and micro irregularities, it is still further difficult to achieve the cooling effect.

Figure 4:
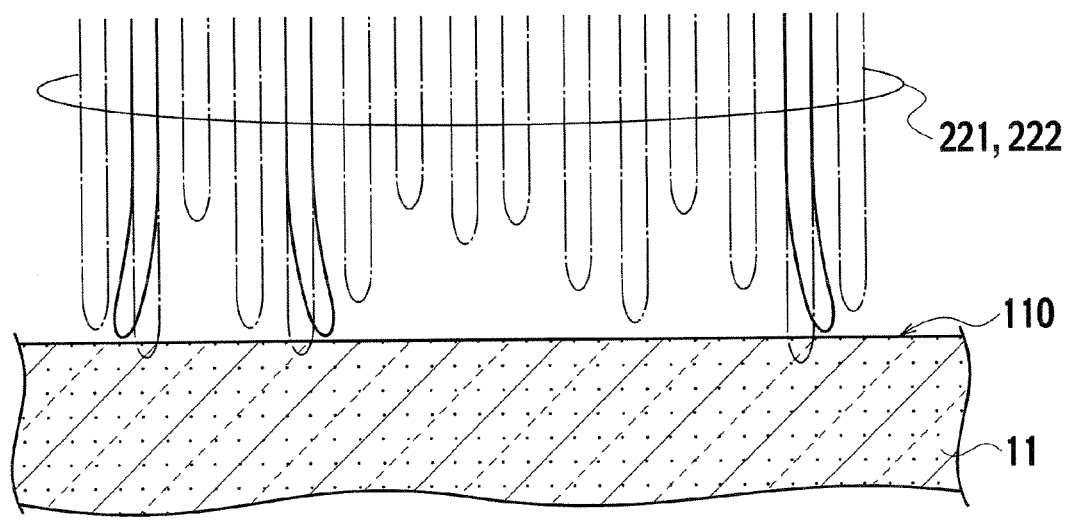
FIG. 4 is a cross section of a main portion showing the pressure contacting state between a device body and a heat sink of the electronic device according to the first embodiment.

On the other hand, the heat sink 20 according to the first embodiment includes a plurality of pressure contacting members (the first and second pressure contacting members 221 and 222) in the shape of projecting elongated columns on the surface of the base portion 21. As shown in FIG. 4, the first and second pressure contacting members 221 and 222 are subjected to buckling deformation with respect to a slight pressure contacting load. Here, the top surface of the base portion 21 includes irregularities corresponding to the surface roughness or the like. Accordingly, the first and second pressure contacting members 221 and 222 provided on a surface opposite to the top surface have a distribution (a shape of steps) of heights (lengths) corresponding to the surface irregularities (a step shape) of the base portion 21.

Figure 5:
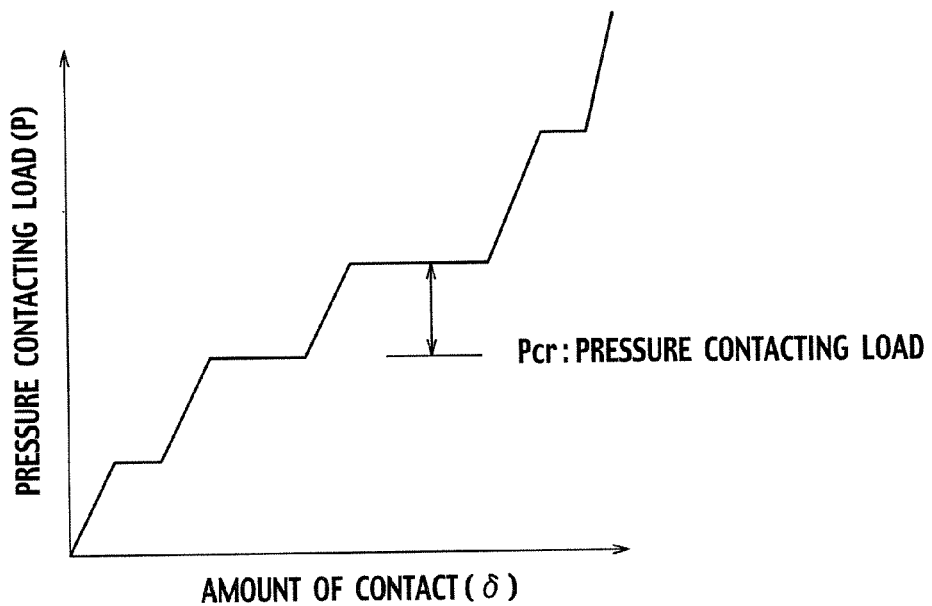
FIG. 5 is a graph showing a relationship between the pressure contacting load and the amount of contact in the electronic device according to the first embodiment.

As the pressure contacting surface (a smooth surface) 110 of the device body 10 approaches the groups of pressure contacting members, i.e., the plurality of first and second pressure contacting members 221 and 222, of the heat sink 21, the pressure contacting surface 110 first comes contact with the leading tip of a pressure contacting member of the groups of the pressure contacting members having the greatest height. A pressure contacting load is then applied to this pressure contacting member, and, once the pressure contacting load exceeds the buckling load of the pressure contacting member, the pressure contacting member deforms by buckling. Subsequently, the pressure contacting surface 110 contacts the tip of the next highest pressure contacting member, to which a pressure contacting load is applied to cause the pressure contacting member to deform by buckling. Thus, a series of contact and buckling deformation steps are to be repeated. Here, because the pressure contacting member which is once buckling deformed can be subjected to further deformation by a load which is equal to or less than the pressure contacting load required for the buckling deformation, the number of pressure contacting members contacting the pressure contacting surface 110 of the device body 10, i.e. the number of contact points, is proportional to the pressure contacting load, as shown in FIG. 5. In FIG. 5, the vertical axis indicates the pressure contacting load P and the horizontal axis indicates the approaching amount δ of the pressure contacting surface 110 of the substrate 11 with respect to the tips of the pressure contacting members 221 and 222 of the heat sink 20, and a sign Pcr indicates the pressure contacting load per pressure contacting member. Specifically, according to the present embodiment, it is possible to secure an appropriate number of contact points in accordance with the increase in the pressure contacting load, independently of the distribution of the heights of the pressure contacting members corresponding to the surface irregularities of the self-supported insulating diamond substrate 210. With the increase in the number of contact points between the pressure contacting surface 110 and the pressure contacting members 221 and 222, the total contact area can also be increased, so that contact heat resistance between the device body 10 and the heat sink 20 can be reduced.

Figure 6:
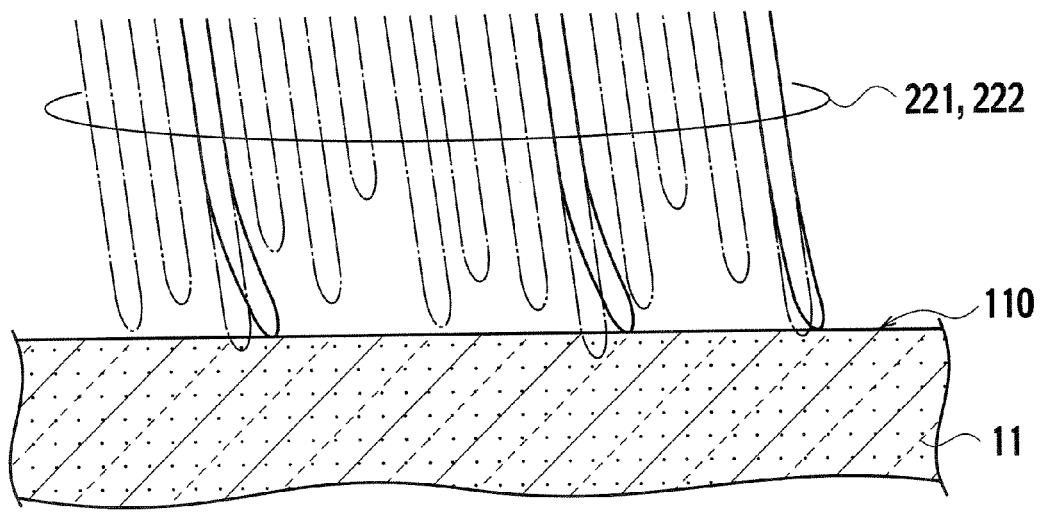
FIG. 6 is a cross section of a main portion showing another pressure contacting state between a device body and a heat sink of the electronic device according to the first embodiment.

FIG. 6 shows that the groups of pressure contacting members of the heat sink 20 are to be pressure contacted to the pressure contacting surface 110 of the substrate 11 with the pressure contacting members being slightly inclined with respect to pressure contacting surface 110 due to the slope and curve of the surface of the self-supported insulating diamond substrate 210. In this case, as moment is generated in the first and second pressure contacting members 221 and 222, it is possible to reliably allow the first and second pressure contacting members 221 and 222 to buckle with a small pressure contacting load. As a result, a large number of contact points can be obtained to thereby reduce the contact heat resistance.

[Manufacturing Method of Heat Sink and Electronic Device of the First Embodiment]

A method of manufacturing the heat sink 20 according to the first embodiment and also a method of manufacturing (assembling) the electronic device 1 including this heat sink 20 will be described.

First, an insulating diamond substrate 200 is provided. For the insulating diamond substrate 200, a self-supported insulating diamond substrate having high heat conductivity and an insulating property, and also containing polycrystalline diamond having a crystal grain size in units of μm is used. The insulating diamond substrate 200 can be manufactured as a polycrystalline diamond film by first forming a polycrystalline diamond film having a thickness of 400 μm to 500 μm on an Si substrate using a CVD method using hydrogen gas and methane gas and then removing the Si substrate by etching or the like. The film formation temperature at the time of forming a polycrystalline diamond film by CVD method is approximately 800° C.

Figure 7:
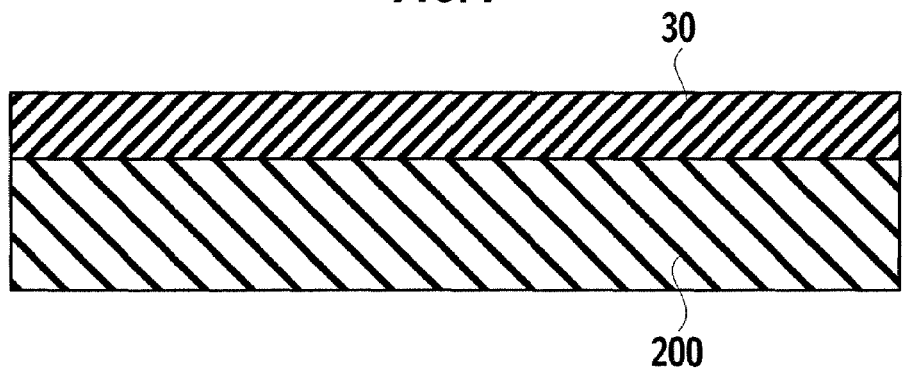
FIG. 7 is a cross section showing a first process for explaining a method of manufacturing the heat sink and the electronic device according to the first embodiment.

Then, a porous coat film 30 is formed on the surface of the insulating diamond substrate 200 (see FIG. 7). A high-purity aluminum (Al) film formed by sputtering to have a thickness of 1.5 μm to 2.0 μm, for example, can be practically used as this porous coat film 30.

Figure 8:
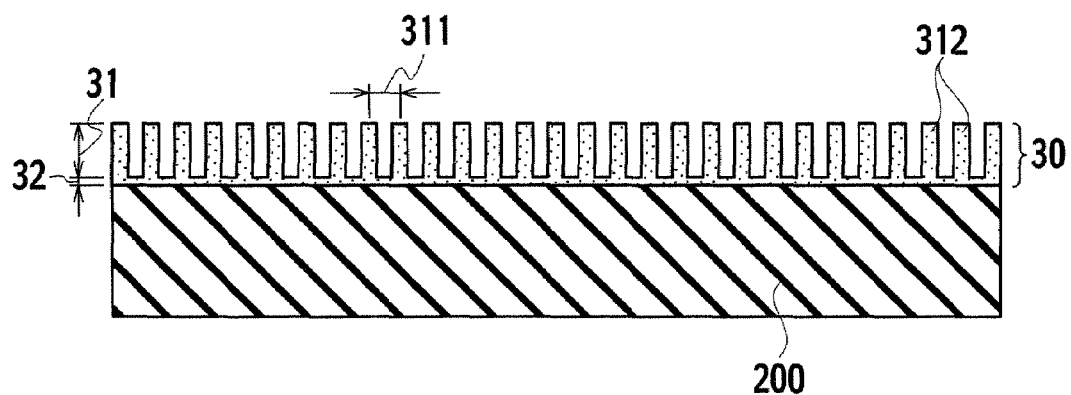
FIG. 8 is a cross section showing a second process.
Figure 13:
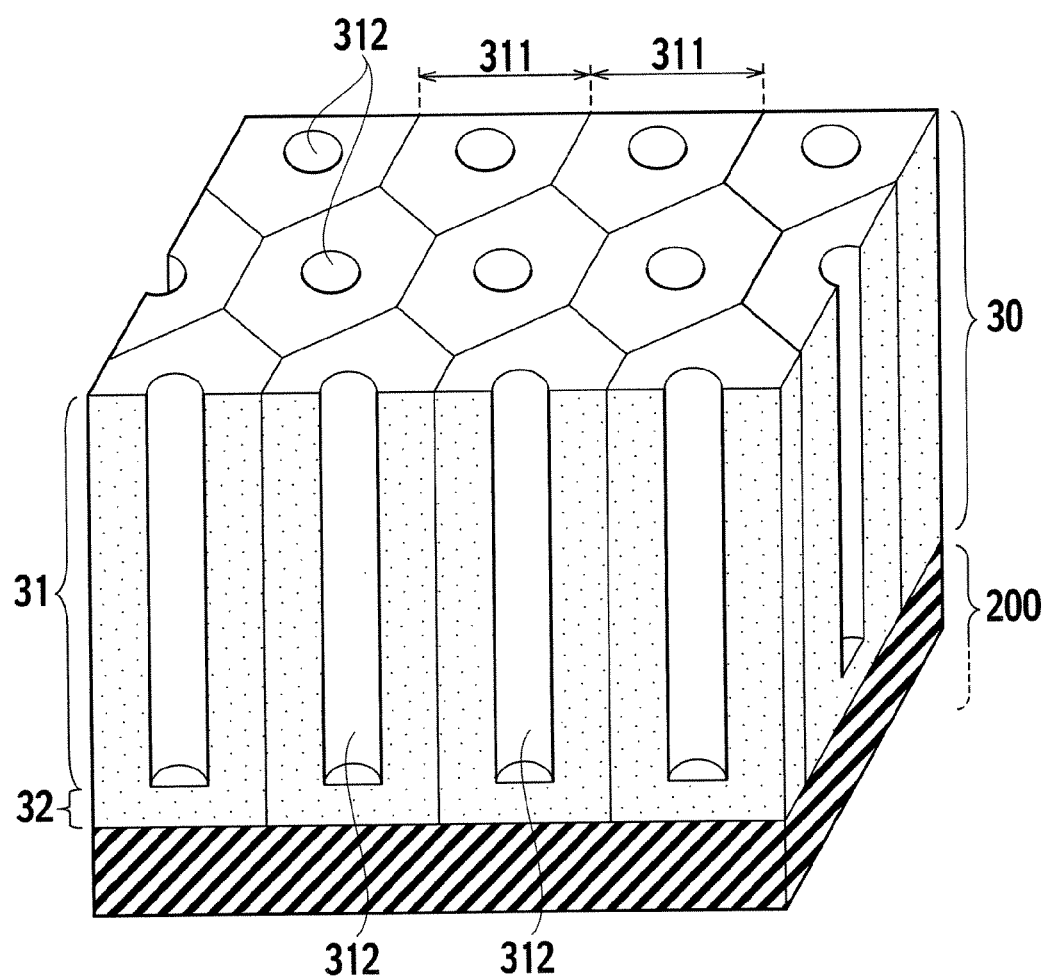
FIG. 13 is a perspective view of a main portion showing a state after anodization of a porous coat film in the process of manufacturing the heat sink shown in FIG. 8.

Further, the porous coat film 30 is anodized in an acid solution such as a sulfuric solution to thereby form a porous layer 31 having a pore 312 in each coat cell 311, and also a barrier layer 32 is formed at the bottom of the pores 312 (see FIG. 8). With the anodization, a surface layer of the above-described Al film functioning as the porous coat film 30 is transformed into an alumina ($Al_2O_3$) film, so that the pore 312 having an elongated shape can be formed from the surface toward the depth direction at the center portion of each coat cell 311 having a hexagonal column shape, as shown in FIG. 13.

With anodization, the number of the pores 312 can be controlled to a range of $10^9/cm^2$ to $10^{11}/cm^2$, for example, and the internal diameter of the pores 312 can be controlled to a range of 10 nm to 100 nm. Further, the thickness of the barrier layer 32 and the size of the coat cell 311 can be controlled to be within a range of 10 nm to 100 nm. Each of the number and the inside diameter of the pores 312, the thickness of the barrier layer 32, and the size of the coat cell 311 as described above depends only on the voltage to be applied at the time of anodization and does not depend on the temperature or the concentration of the solution. It is therefore possible to control these parameters by adjusting the voltage at the time of anodization. In the first embodiment, the pores 312 each having the inside diameter of 15 nm to 25 nm and the depth of 1.5 μm to 2.5 μm are formed in the porous layer 31 of the porous coat film 30.

Actually, the pores 312 thus formed by anodization are wider on the top surface side and become narrower towards the bottom. However, because the depth required for the pores 312 is only approximately several μm and also the inside diameter thereof ranges between several tens of μm and several hundreds of μm, the sectional structure of the pore 312 can be regarded as substantially a column shape.

Figure 9:
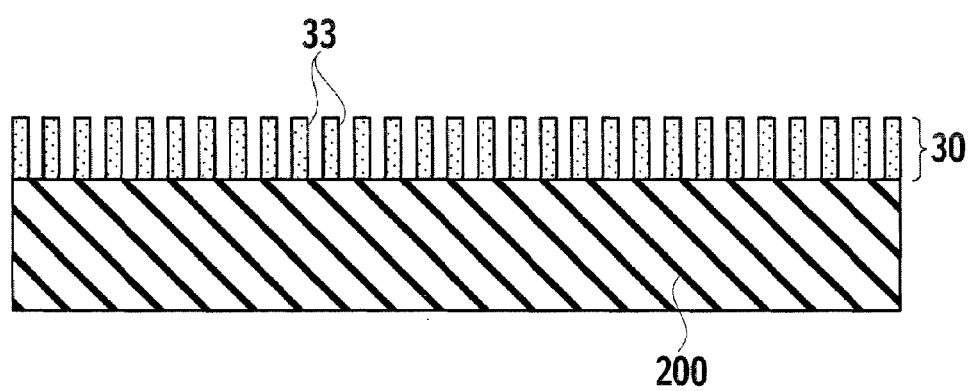
FIG. 9 is a cross section showing a third process.

Subsequently, the barrier layer 32 existing at the bottom portion of the pores 312 of the porous coat film 30 is removed through the pores 312 to form holes 33 connecting from the top surface of the porous coat film 30 through the rear surface thereof (see FIG. 9). The barrier layer 32 is removed by using anisotropy etching such as reactive ion etching (RIE), for example, which can achieve high speed etching in the direction vertical to the surface of the porous coat film 30.

Figure 10:
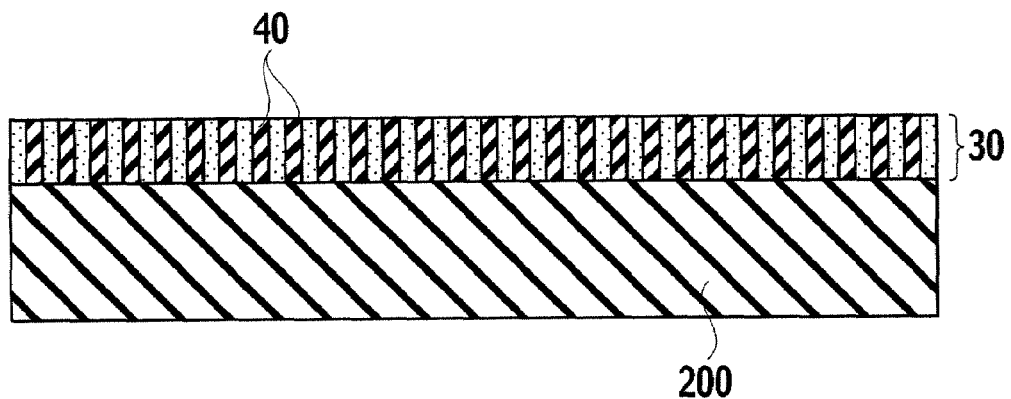
FIG. 10 is a cross section showing a fourth process.

Then, a mask 40 is buried in the holes of the porous coat film 30 (see FIG. 10). Specifically, the mask 40 can be formed by forming an oxide film ($SiO_2$) over the surface of the porous coat film 30 including the inner portion of the holes 33, for example, using CVD, and then removing the oxide film thus formed using RIE, chemical mechanical polishing (CMP) until the surface of the porous coat film 30 is exposed.

Figure 11:
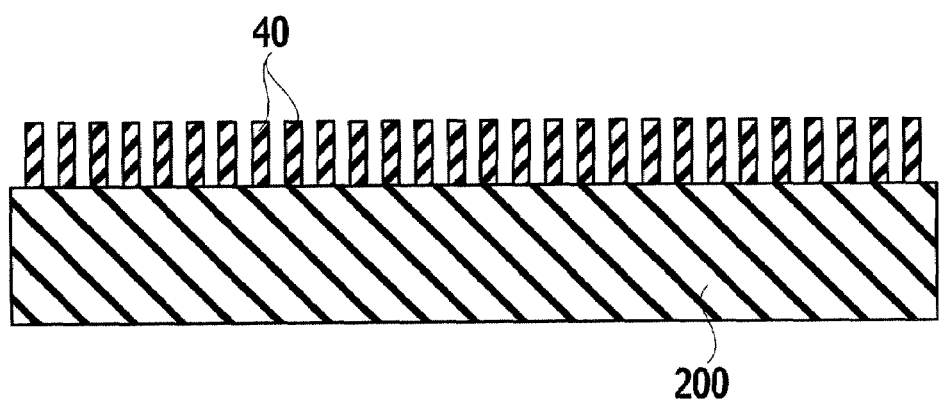
FIG. 11 is a cross section showing a fifth process.

Further, the porous coat film 30 is selectively removed to form the mask 40 having elongated columns on the surface of the insulating diamond substrate 200 (see FIG. 11). The porous coat film 30 is removed by using RIE, for example. The mask 40 will be used as a mask for forming groups of pressure contacting members including the first pressure contacting members 221 and the second pressure contacting members 222 on the surface layer of the insulating diamond substrate 200.

Figure 12:
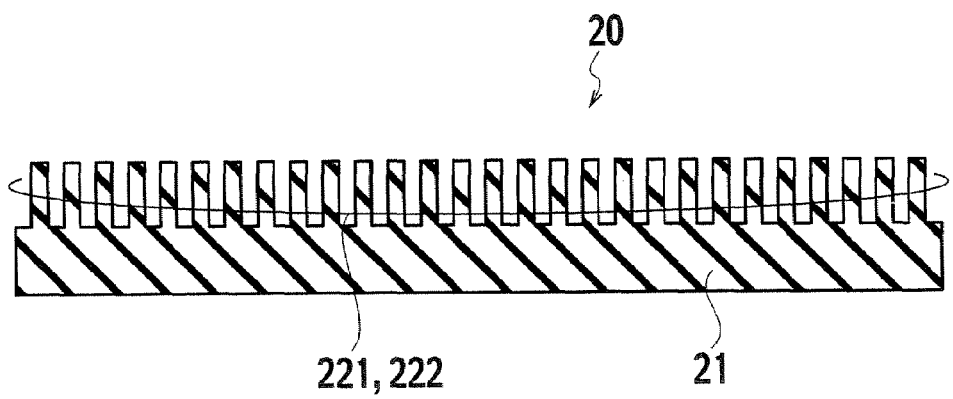
FIG. 12 is a cross section showing a sixth process.

Finally, with the mask 40 used as an etching mask, a portion of the insulating diamond substrate 200 is etched in the thickness direction from top surface toward the rear surface to thereby form the first pressure contacting members 221 and the second pressure contacting members 222 having an elongated shape (see FIG. 12). The etching in the thickness direction can be achieved by RIE or the like. For RIE, a mixed etching gas containing $CF_4$ gas and $O_2$ gas can be used.

When a series of processes described above are completed, the heat sink 20 including the base portion 21 containing, as a main composition, polycrystalline diamond having a crystal grain size in units of μm and the first pressure contacting members 221 and the second pressure contacting members 222 provided projecting on the base portion 21 can be manufactured.

Then, the device body 10 manufactured by a conventional known process is provided, and the first pressure contacting members 221 of the heat sink 20 are pressure contacted onto the heat generation portions 12 of the device body 10 and the second pressure contacting members 222 of the heat sink 20 are pressure contacted onto the non heat generation portions 13 of the device body 10. With completion of this process, the electronic device 1 in which the heat sink 20 is mounted on the device body 10 can be manufactured.

[Characteristics of Heat Sink and Electronic Device]

As described above, in the heat sink 20 of the first embodiment, the insulating diamond substrate 200 having a crystal grain size in units of μm is used to form the base portion 21 and the first and second pressure contacting members 221 and 222 to be pressure contacted onto the device body 10. With this structure, the crystal grain boundaries existing in the heat propagation route can be reduced to thereby decrease contact heat resistance, so that the cooling efficiency can be increased.

Further, in the electronic device 1, the heat sink 20 as described above is provided so that heat generated from the heat generation portions 12 of the substrate 11 can be efficiently distributed in the non heat generation portions 13 through the first pressure contacting members 221, the base portion 21, and the second pressure contacting members 222. Accordingly, the temperature distribution can be made uniform over the entire region of the substrate 11, as a result of which the cooling efficiency can be increased.

Still further, in the electronic device 1, the first pressure contacting members 221 and the second pressure contacting members 222 of the heat sink 20 have an elongated shape and are configured to allow buckling deformation with respect to a pressure contacting load. With this structure, it is possible to increase the contact area between the heat generation portions 12 and the first pressure contacting members 221 and the contact area between the non heat generation portions 13 and the second pressure contacting members 222 to thereby reduce contact heat resistance, so that the cooling efficiency can be improved. In particular, even when a hard insulating diamond substrate is used in the base portion 21 of the heat sink 20, a sufficient contact area can be secured between the device body 10 and the heat sink 20 because a plurality of pressure contacting members are formed on the insulating diamond substrate.

In addition, the heat sink 20 can be manufactured in a simple manner as follows. Specifically, the porous coat film 30 is anodized to form a large number of holes 33 which are regularly arranged, and the mask 40 is buried in these holes 33. Then, a portion of the surface layer of the insulating diamond substrate 200 is removed by etching using this mask 40, thereby manufacturing the heat sink 20.

Finally, the electronic device 1 can be manufactured in a simple manner by pressure contacting the heat sink 20 onto the device body 10.

Second Embodiment

In the second embodiment of the present invention, a heat sink 20 is provided in which a flexible property is further added to the heat sink 20 of the first embodiment.

[Structure of Heat Sink and Electronic Device Including the Same]

Figure 14:
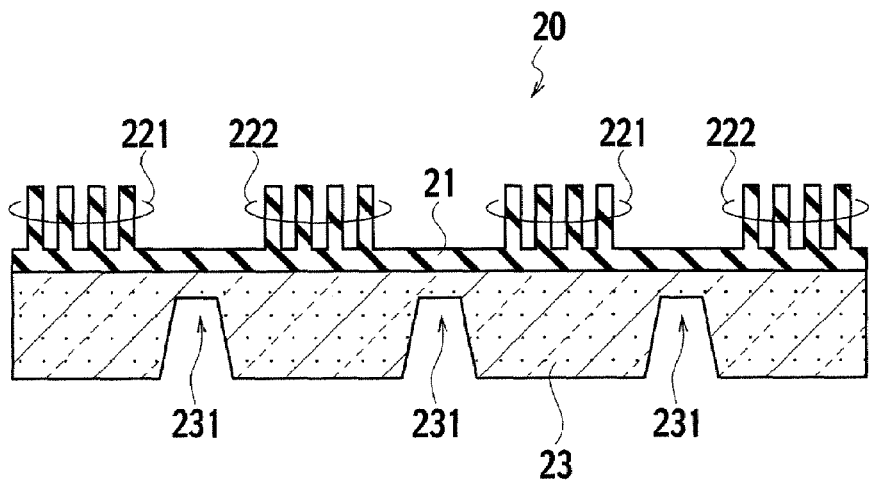
FIG. 14 is a schematic cross section of a heat sink provided in an electronic device according to a second embodiment of the present invention.

As shown in FIG. 14, the heat sink 20 according to the second embodiment includes a fixing base member (bending substrate) 23 having slots (bending slots or bending trenches) 231 for causing warp of the base portion 21 on a rear surface (a second surface) of the base portion 21 opposite to a top surface (a first surface) on which the pressure contacting members 221 and 222 are provided. With this structure, the heat sink 20 as a whole can be curved with respect to the slots 231 and can therefore have flexibility. Other portions of the heat sink 20 of the second embodiment are the same as those of the heat sink 20 of the first embodiment and will not be described.

Further, in the heat sink 20 according to the second embodiment, the first pressure contacting members (the first groups of pressure contacting members) 221 to be pressure contacted onto the heat generation portions 12 of the device body 10 and the second pressure contacting members (the second groups of pressure contacting members) 222 to be pressure contacted onto the non heat generation portions 13 of the device body 10 shown in FIG. 1 are spaced apart from each other. With the first pressure contacting members 221 and the second pressure contacting members 222 thus provided spaced from each other, the device body 10 and the heat sink 20 are partially pressure contacted to each other. Further, the heat sink 20 can be deformed so as to increase the adhesion of the pressure contacted portions.

Practically, it is possible to use an Si substrate as the fixing base member 23. Si substrates can provide high adaptability in the semiconductor manufacturing process and can also achieve stable machining of the bending slots 231.

[Manufacturing Method of Heat Sink and Electronic Device of Second Embodiment]

A method of manufacturing the heat sink 20 according to the second embodiment and also a method of manufacturing (a method of assembling) an electronic device 1 including this heat sink 20 will be described.

First, a fixing base member 23 is provided, and an insulating diamond layer 200 is formed on a surface of the fixing base member 23. Here, because "the insulating diamond layer 200" in the second embodiment has the same function as that of "the insulting diamond substrate 200" of the heat sink 20 according to the first embodiment described above, the same numeral 200 is used for the both members for explanation. The fixing base member 23 is used as a base substrate on which the insulating diamond layer 200 is to be formed, and an Si substrate having a thickness of 500 μm to 700 μm, for example, can be used. The insulating diamond layer 200 is formed of a polycrystalline self-supported insulating diamond layer having high heat conductivity, an insulating property, and also having a crystal grain size in units of μm. While the insulating diamond layer 200 can be formed in the same manner as that of the insulating diamond substrate 200 of the first embodiment, in the second embodiment, the thickness of the insulating diamond layer 200 is set to a small thickness, such as between 1 μm and 3 μm, for example.

Figure 15:
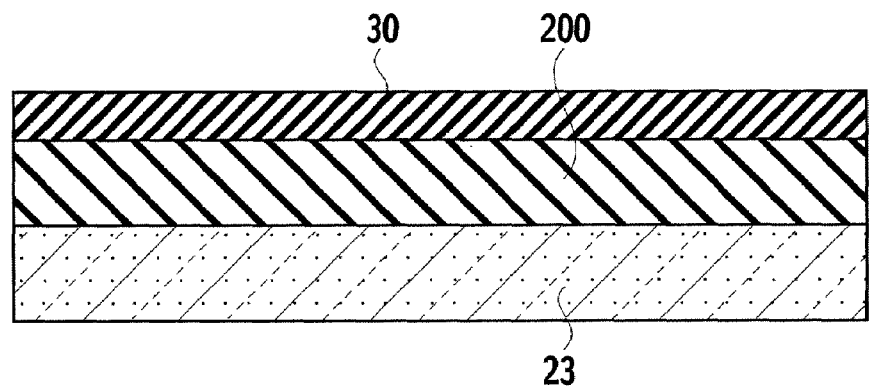
FIG. 15 is a cross section showing a first process for explaining a method of manufacturing the heat sink and the electronic device according to the second embodiment.

Subsequently, a porous coat film 30 is formed on the surface of the insulating diamond layer 200 (see FIG. 15). As in the first embodiment, it is practically possible to use an Al thin film having a thickness of 1.5 μm to 2.0 μm as the porous coat film 30.

Figure 16:
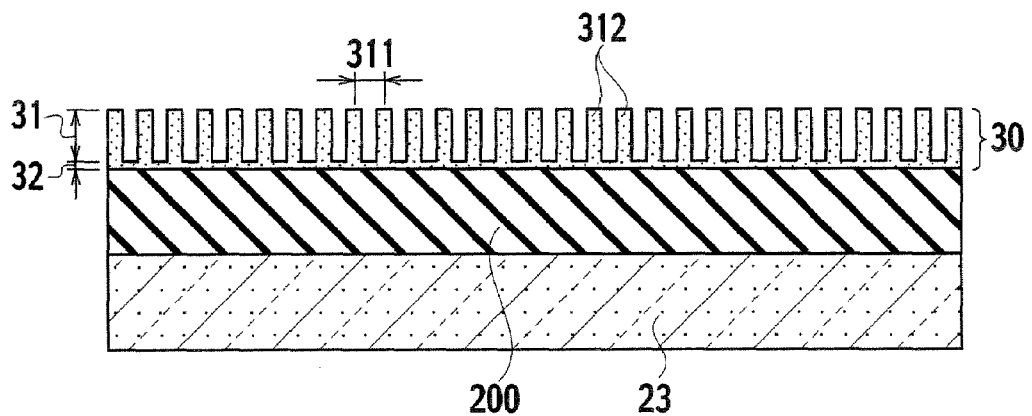
FIG. 16 is a cross section showing a second process.

Then, as in the first embodiment, the porous coat film 30 is anodized in an acid solution such as a sulfuric solution to thereby form a porous layer 31 having a pore 312 in each coat cell 311 as shown in FIG. 13, and also a barrier layer 32 is formed at the bottom of the pores 312 (see FIG. 16). The inner diameter and the depth of the pore 312 of the porous layer 31 are set, for example, to 15 nm to 25 nm and 1.5 μm to 2.5 μm, respectively.

Figure 17:
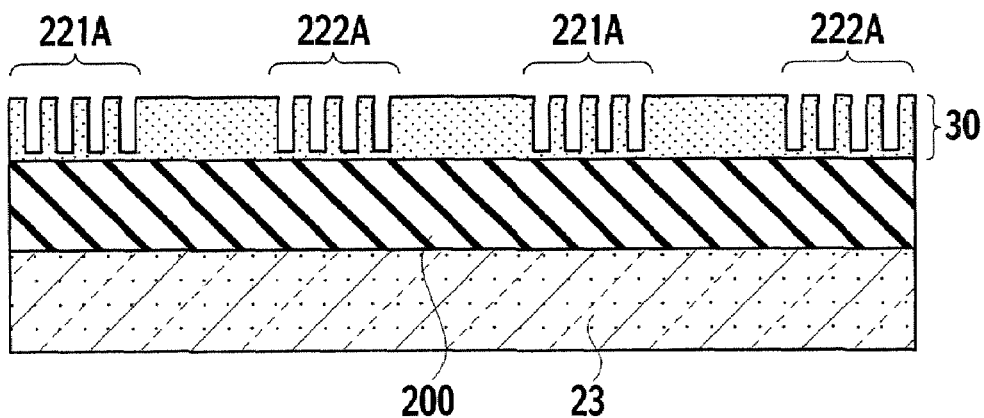
FIG. 17 is a cross section showing a third process.

Then, in the porous coat film 30 (or the porous layer 31), regions other than a forming region 221A of the first pressure contacting members 221 corresponding to the heat generation portions 12 of the device body 10 and a forming region 222A of the second pressure contacting members 222 corresponding to the non heat generation portions 13 are subjected to a sealing process. In this sealing process, a protective film is formed over the forming regions 221A and 222A, and then portions of the porous coat film 30 exposed out of the protective film are brought into contact with boiling water or heated vapor to accelerate oxidization of the porous coat film 30, in particular the inner walls of the pores 312. Once the sealing process is completed, the pores 312 can be completely enclosed (see FIG. 17).

Figure 18:
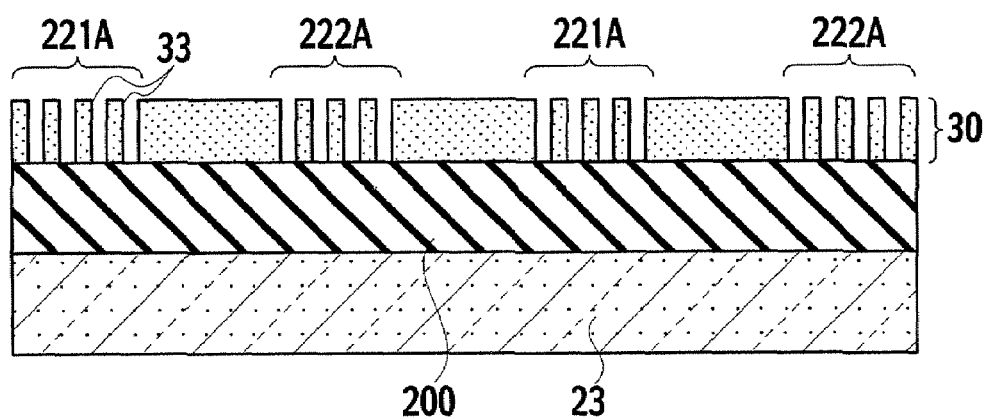
FIG. 18 is a cross section showing a fourth process.

After the sealing process, in the forming regions 221A and 222A, the barrier layer 32 existing at the bottom of the porous coat film 30 is removed through the pores 312, thereby forming the holes 33 connecting from the top surface of the porous coat film 30 to the rear surface thereof (see FIG. 18). The barrier layer 32 is removed using RIE or the like as in the first embodiment.

Figure 19:
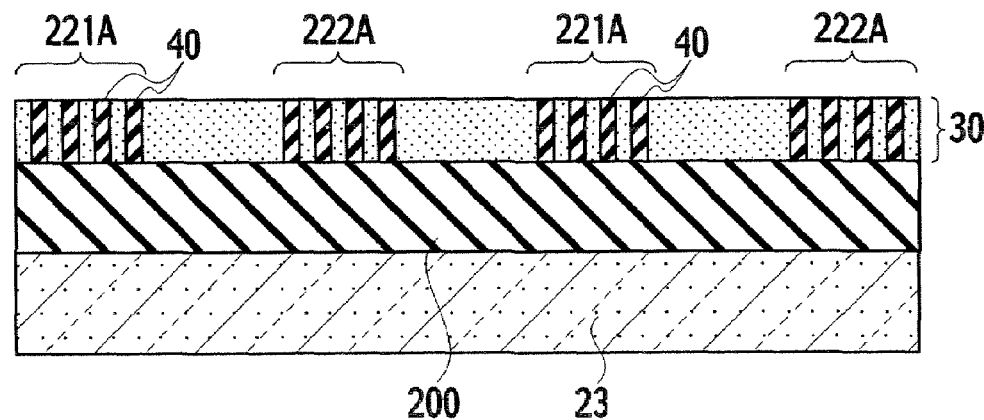
FIG. 19 is a cross section showing a fifth process.

Then, a mask 40 is buried in the interior of the holes 33 of the porous coat film 30 (see FIG. 19). The mask 40 can be formed by an oxide film as in the first embodiment.

Figure 20:
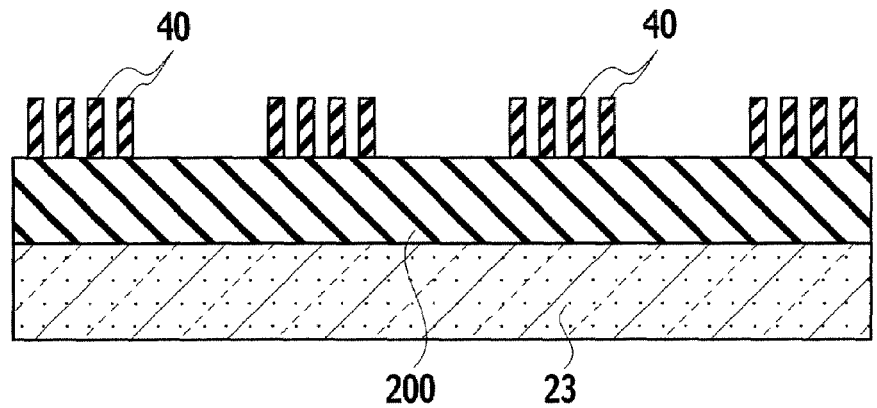
FIG. 20 is a cross section showing a sixth process.

Subsequently, the porous coat film 30 is selectively removed to form the mask 40 having elongated column shape on the surface of the insulating diamond layer 200 (see FIG. 20). This mask 40 is used for forming the groups of pressure contacting members including the first and second pressure contacting members 221 and 222 on the surface of the polycrystalline diamond film 200.

Figure 21:
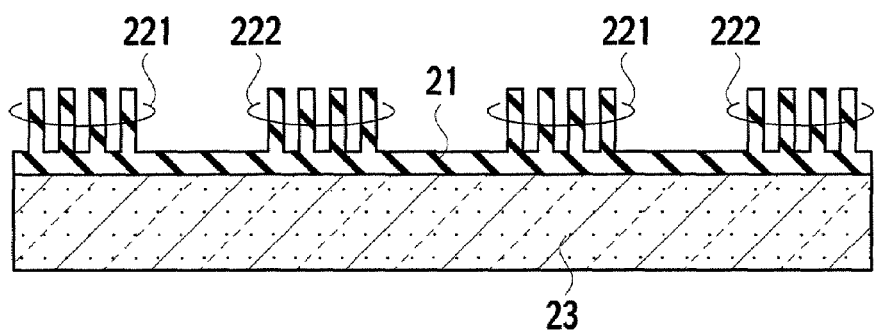
FIG. 21 is a cross section showing a seventh process.

Finally, with the mask 40 being used as an etching mask, a portion of the insulating diamond layer 200 is etched in the thickness direction from the top surface towards the rear surface thereof to thereby form the first pressure contacting members 221 having an elongated shape in the forming region 221A and the second pressure contacting members 222 in the forming region 222A (see FIG. 21). The etching in the thickness direction is performed using RIE or the like. Here, when RIE is employed, a mixed etching gas containing $CF_4$ gas and $O_2$ gas can be used.

Then, the slots 231 are formed in the fixing base member 23 from the rear surface toward the top surface thereof, as shown in FIG. 14 described above. The slots 231 are formed by RIE or the like, using a mask which is formed due to a photolithography technique.

Upon completion of a series of the above steps, the heat sink 20 including the insulating diamond layer 200 containing, as a main composition, polycrystalline diamond having a crystal grain size in units of μm and the first and second pressure contacting members 221 and 222 which are disposed on the insulating diamond layer 200 can be manufactured.

Figure 22:
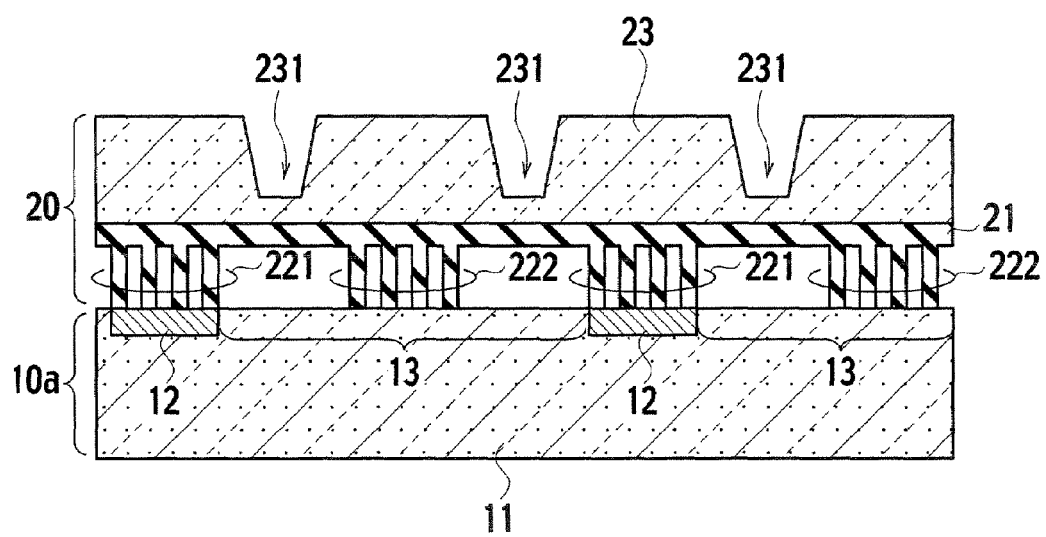
FIG. 22 is a schematic cross section of an electronic device including the heat sink according to the second embodiment.

Further, the device body 10 manufactured by a conventionally known process is provided, and the first pressure contacting members 221 of the heat sink 20 are pressure contacted onto the heat generation portions 12 of the device body 10 and the second pressure contacting members 222 of the heat sink 20 are pressure contacted onto the non heat generation portions 13 of the device body 10 in the pressure contacting method as described above. Upon completion of this step, the electronic device 1 in which the heat sink 20 is mounted on the device body 10 can be manufactured, as shown in FIG. 22.

[Characteristics of Heat Sink and Electronic Device]

As described above, in the heat sink 20 according to the second embodiment, on the rear surface of the base portion 21 which is opposite to the top surface on which the first and second pressure contacting members 221 and 222 are disposed, the fixing base member 23 having the slots 231 for allowing warp of the base portion 21 is provided. Consequently, the fixing base member 23 and the base portion 21 can be curved with respect to the slots 231 of the fixing base member 23, thus achieving flexibility of the heat sink 20. According to the electronic device 1 of the second embodiment, due to the flexibility of the heat sink 20, the device body 10 and the heat sink 20 can be closely adhered to each other regardless of the surface roughness of the device body 10 resulting from the macro irregularities and the micro irregularities thereof, the surface roughness of the heat sink 20 resulting from the macro irregularities, warpage of the whole device body 10, and so on, so that heat resistance between the device body 1 and the heat sink 20 can be reduced to thereby further enhance the cooling effect.

Third Embodiment

According to the third embodiment of the present invention, in the heat sink 20 and the electronic device 1 according to the first embodiment, a heat sink 20 which can be closely attached to a device body 10 while corresponding to the surface roughness resulting from macro irregularities of a surface of the device body 10 is provided.

[Structure of Heat Sink and Electronic Device Including the Same]

Figure 23:
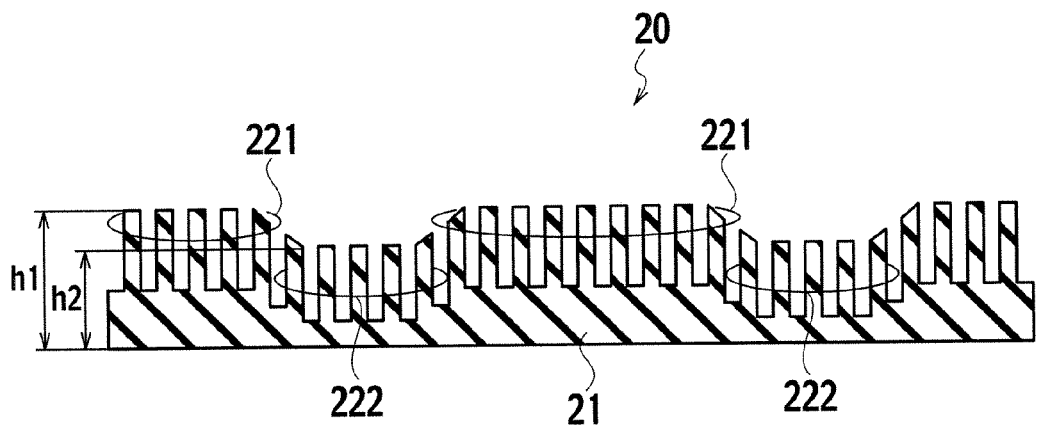
FIG. 23 is a schematic cross section of a heat sink provided in an electronic device according to a third embodiment of the present invention.

As shown in FIG. 23, the heat sink 20 of the electronic device 1 according to the third embodiment includes a plurality of first pressure contacting members 221 having the same height h1 and a plurality of second pressure contacting members 222 having the same height h2 which is shorter than the height h1 of the first pressure contacting members 222. Here, as used herein, both the heights h1 and h2 refer to heights measured from the rear surface of the base portion 21. In other words, in the third embodiment, the height h1 of the first pressure contacting members 221 is set to be higher than the height h2 of the second pressure contacting members 222, and when the heat generation portions 12 of the device body 10 exist in concave portions and the non generation portions 13 of the device body 10 exist in convex portions, it is possible to match the step shapes of the device body 10 and the heat sink 20 to thereby make the device body 10 and the heat sink 20 closely contact with other with their contact surfaces in parallel with each other.

Here, the heat sink 20 according to the third embodiment is applicable not only to the case where the heat generation portions 12 exist in concave portions of the device body 10 and the non heat generation portions 13 exist in convex portion, but also to other cases where the heat generation portions 12 exist in convex portion and the non heat generation portions 13 exist in concave portions and where some of the heat generation portions 12 and some of the non heat generation portions exist in concave portions and other heat generation portions 12 and other non heat generation portions 13 exit in convex portions.

Thus, the surface roughness of the device body 10 is estimated or measured (i.e. the surface roughness is assessed) by using a method of estimating the surface roughness (the step shape) caused by macro irregularities on the surfaces of the heat generation portions 12 and the non heat generation portions 13 of the device body 10, a method of measuring the step shape of the surfaces on which the heat generation portions 12 and the non heat generation portions 13 are provided using an optical non-contact surface roughness measuring device, and so on, and the heat sink 20 may be manufactured so as to adapt to the surface roughness thus estimated or measured. Other portions of the heat sink 20 and the electronic device 1 are the same as those in the first embodiment and will not therefore described again.

[Manufacturing Method of Heat Sink and Electronic Device According to Third Embodiment]

A method of manufacturing the heat sink 20 according to the third embodiment, and also a method of manufacturing (a method of assembling) the electronic device 1 including this heat sink 20 will be described.

Figure 24:
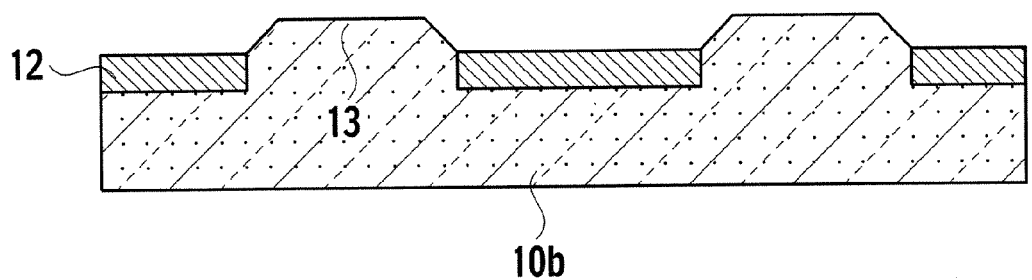
FIG. 24 is a cross section showing a first process for explaining a method of manufacturing the heat sink and the electronic device according to the third embodiment.

First, a device body 10b manufactured by a known process (see FIG. 24, for example) is provided, and a step shape of the surface of the device body 10 on which heat generation portions 12 and non heat generation portions 13 are provided is measured by an optical non contact surface roughness measuring device.

Then, an insulating diamond substrate 200 is provided. Further, based on the step shape of the surface of the device body 10b which is previously measured, macro irregularities corresponding to the step shape of the device body 10b are formed on the insulating diamond substrate 200, such that the insulating diamond substrate 200 is to be closely adhered to the device body 10 with their contact surfaces being parallel to each other (see FIG. 25). As in the manufacturing method according to the first embodiment, a polycrystalline self-supported insulating diamond substrate having high heat conductivity and an insulating property and further having a crystal grain size in units of μm is used as the insulating diamond substrate 200. The formation of the macro irregularities on the surface of the insulating diamond substrate 200 is performed using anisotropy etching such as bias sputtering and RIE in which a side etching amount is increased.

Figure 25:
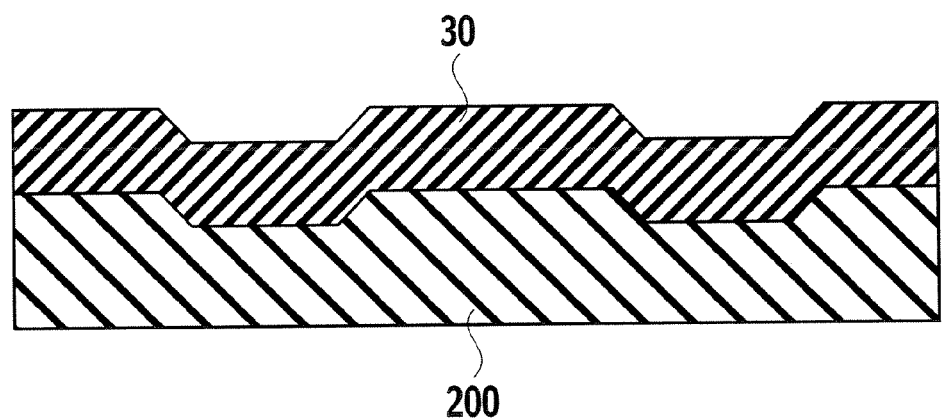
FIG. 25 is a cross section showing a second process.

Further, a porous coat film 30 is formed on the surface of the insulating diamond substrate 200 (see FIG. 25). With regard to the process of forming the porous coat film 30 and the subsequent processes, the manufacturing process and manufacturing conditions which are substantially the same as those in the first embodiment described above will be used.

Figure 26:
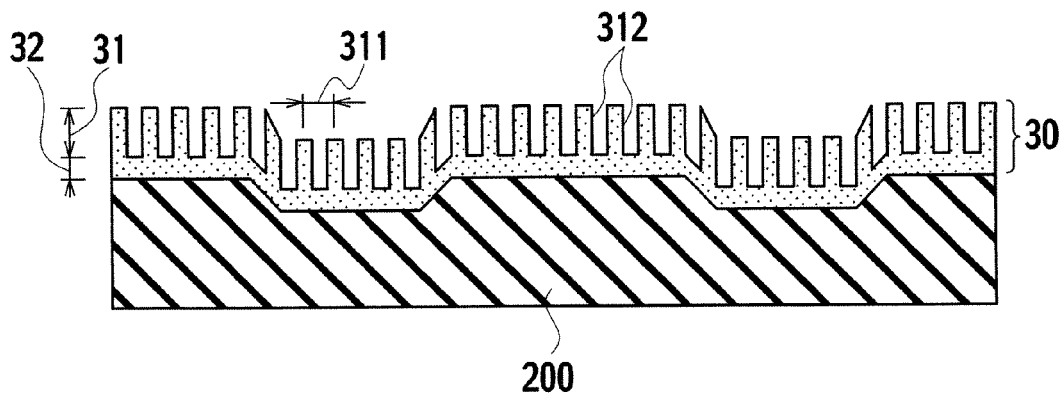
FIG. 26 is a cross section showing a third process.
Figure 27:
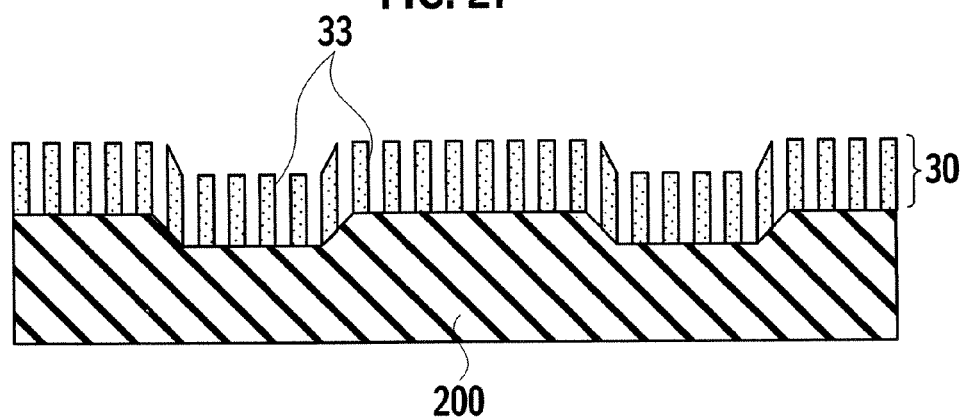
FIG. 27 is a cross section showing a fourth process.

Then, the porous coat film 30 is anodized in an acid solution such as a sulfuric acid solution to thereby form a porous layer 31 having a pore 312 in each coat cell 311 as shown in FIG. 13 and also form a barrier layer 32 at the bottom portion of the pores 312 (see FIG. 26). Subsequently, the barrier layer 32 existing at the bottom portion of the pores 312 of the porous coat film 30 is removed through the pores 312, thereby forming holes 33 connecting from the top surface of the porous coat film 30 through the rear surface thereof (see FIG. 27).

Figure 28:
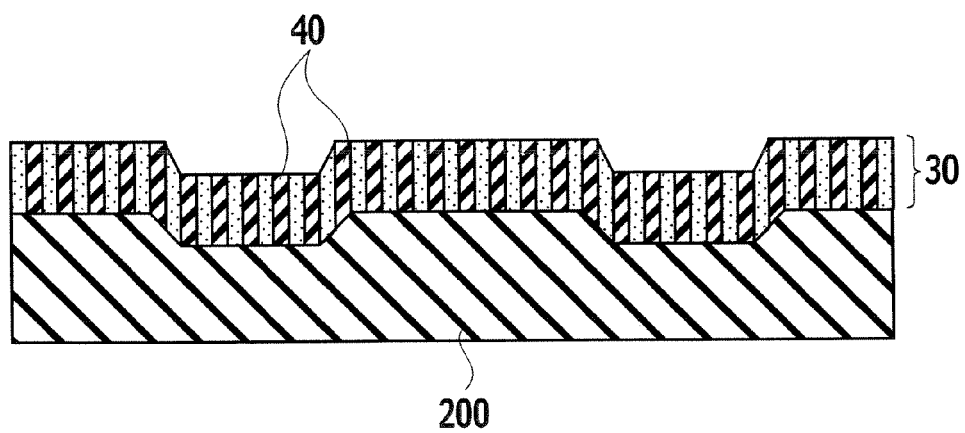
FIG. 28 is a cross section showing a fifth process.
Figure 29:
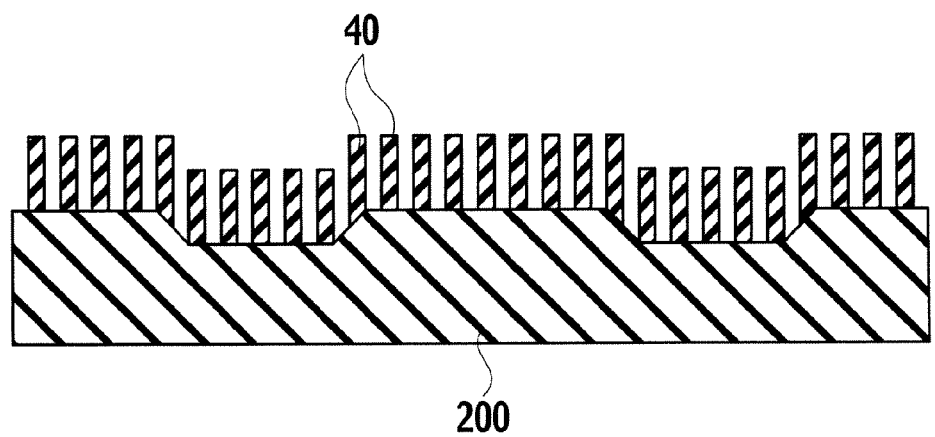
FIG. 29 is a cross section showing a sixth process.

Further, a mask 40 is buried in the interior of the holes 33 of the porous coat film 30 (see FIG. 28). Then, the porous coat film 30 is selectively removed to thereby form the mask 40 having an elongated column shape on the surface of the insulating diamond substrate 200 (see FIG. 29).

Finally, with the mask 40 being used as an etching mask, a portion of the insulating diamond substrate 200 is removed in the thickness direction from the top surface thereof toward the rear surface thereof, thereby forming the first pressure contacting members 221 and the second pressure contacting members 222 having an elongated shape.

With the completion of a series of the above steps, the heat sink 20 including the base portion 21 containing, as a main composition, polycrystalline insulating diamond having a crystal grain size in units of μm and the first pressure contacting members 221 and the second pressure contacting members 222 provided to project from the base portion 21 can be manufactured.

Figure 30:
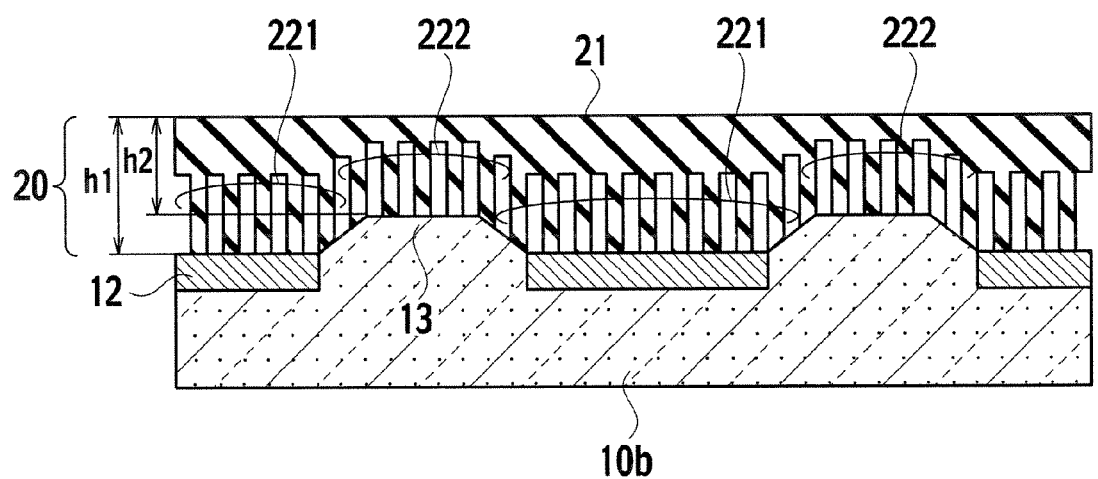
FIG. 30 is a schematic cross section of the electronic device having the heat sink according to the third embodiment of the invention.

Then, the first pressure contacting members 221 of the heat sink 20 are pressure contacted onto the heat generation portions 12 of the device body 10b described above and the second pressure contacting members 222 are pressure contacted onto the non heat generation portions 13 of the device body 10b in the pressure contacting method described above (see FIG. 30). With the completion of this step, the electronic device 1 formed by mounting the heat sink 20 onto the device body 10b can be completed.

[Characteristics of Heat Sink and Electronic Device]

As described above, the heat sink 20 according to the third embodiment includes the first pressure contacting members 221 and the second pressure contacting members 222 having different surface roughness corresponding to the macro irregularities of the surface of the device body 10, so that adhesiveness between the heat sink 20 and the device body 10b can be enhanced to thereby reduce heat resistance between them, leading to further increase in the cooling effect. As such, with the heat sink 20 having surface roughness corresponding to the macro irregularities of the surface of the device body 10b, the electronic device 10 according to the third embodiment allows the device body 10b and the heat sink 20 to be closely adhered to each other, so that heat resistance between the device body 10b and the heat sink 20 can be reduced, thereby further increasing the cooling effect.

Other Embodiments

It should be understood that the present invention is not limited to the exemplary embodiments described above, and may be applicable to an electronic device including a plurality of semiconductor chips which are mounted on a single circuit substrate, an electronic device including both semiconductor chips and laser oscillators which are provided on a circuit substrate, and so on, in which a heat sink therein requires high cooling efficiency.

As described so far, the present invention provides a heat sink having high heat conductivity and excellent cooling efficiencies and an electronic device including this heat sink.

Further, the present invention provides a method of manufacturing a heat sink having high heat conductivity and excellent cooling efficiencies and a method of manufacturing an electronic device including such a heat sink.

What is claimed is:

1. A heat sink comprising:
    a base portion formed of insulating diamond;
    a plurality of first pressure contacting members formed of the insulating diamond and arranged on the base portion;
    a plurality of second pressure contacting members spaced apart from the first pressure members on the base portion and formed of the insulating diamond; and
    a fixing base member provided on a second surface of the base portion opposite to a first surface on which the first and second pressure contacting members are arranged, the fixing base member having a slot provided on an area on the second surface, the area is opposite to a space between the first pressure contacting members and the second pressure contacting members.

2. The heat sink of claim 1, wherein the insulating diamond is formed of polycrystalline diamond.

3. An electronic device comprising:
    a substrate on which a device is formed having heat generation portions in a first region and having non heat generation portions in a second region which is different from the first region; and
    a heat sink having:
    a base portion formed of insulating diamond and a plurality of first pressure contacting members which are pressure contacted onto the heat generation portions of the substrate;
    a plurality of second pressure contacting members which are pressure contacted onto the non heat generation portions of the substrate, the first pressure contacting members and the second pressure contacting members being formed of the insulating diamond and spaced apart from each other on the base portion; and
    a fixing base member provided on a second surface of the base portion opposite to a first surface on which the first and second pressure contacting members are arranged, the fixing base member having a slot provided on an area on the second surface, the area is opposite to a space between the first pressure contacting members and the second pressure contacting members.

4. The electronic device of claim 3, wherein
    the first pressure contacting members and the second pressure contacting members of the heat sink are pressure contacted onto the heat generation portions and the non heat generation portions, respectively, in a buckled state.

5. The electronic device of claim 3, wherein
    the substrate is a semiconductor substrate, and
    the heat generation portions are regions in which a circuit including an element is disposed and the non heat generation portions are regions in which the element is not disposed.

6. The electronic device of claim 3, wherein
    the plurality of first pressure contacting members of the heat sink have a height which is different from a height of the plurality of second pressure contacting members.

7. The electronic device of claim 3, wherein
    the heat sink diffuses heat generated from the heat generation portions into the non heat generation portions, through each of the plurality of first pressure contacting members, the base portion, and the second pressure contacting members.

* * * * *